US007835468B2

(12) United States Patent
Elenes et al.

(10) Patent No.: US 7,835,468 B2
(45) Date of Patent: Nov. 16, 2010

(54) IMPULSE DETECTION AND REDUCTION IN A FREQUENCY MODULATION RADIO RECEIVER

(75) Inventors: Javier Elenes, Austin, TX (US); Dana J. Taipale, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 1283 days.

(21) Appl. No.: 11/374,577

(22) Filed: Mar. 13, 2006

(65) Prior Publication Data

US 2007/0211830 A1  Sep. 13, 2007

(51) Int. Cl.
*H04L 27/00* (2006.01)
*H03K 7/06* (2006.01)
*H03D 3/00* (2006.01)

(52) U.S. Cl. .................... 375/324; 375/271; 375/322

(58) Field of Classification Search ................ 375/334, 375/335, 272, 344, 271, 302, 316, 322, 324, 375/323, 346, 371; 332/117; 455/313, 205, 455/118, 42; 714/700
See application file for complete search history.

(56) References Cited

U.S. PATENT DOCUMENTS

| | | | | |
|---|---|---|---|---|
| 4,675,882 A * | 6/1987 | Lillie et al. | ................. | 375/324 |
| 4,821,120 A * | 4/1989 | Tomlinson | .................. | 348/727 |
| 5,311,087 A * | 5/1994 | Suganuma | .................... | 327/94 |
| 5,412,687 A * | 5/1995 | Sutton et al. | ................. | 375/133 |
| 5,465,413 A * | 11/1995 | Enge et al. | .................. | 455/307 |
| 5,764,102 A * | 6/1998 | Cochran et al. | ............. | 329/304 |
| 6,081,537 A * | 6/2000 | Kaneko et al. | .............. | 370/480 |
| 6,091,765 A | 7/2000 | Pietzold | | |
| 6,347,146 B1 * | 2/2002 | Short et al. | .................... | 381/15 |
| 6,359,897 B1 | 3/2002 | Hessel | | |
| 6,647,070 B1 * | 11/2003 | Shalvi et al. | ................. | 375/285 |
| 6,661,834 B1 * | 12/2003 | Shan et al. | ................... | 375/147 |
| 6,771,720 B1 * | 8/2004 | Yang et al. | ................... | 375/345 |
| 6,788,923 B2 * | 9/2004 | Tsujishita et al. | ........... | 455/223 |
| 6,944,301 B1 * | 9/2005 | Nohrden et al. | ............... | 381/13 |
| 6,999,522 B2 * | 2/2006 | Shearer, III | ................. | 375/295 |
| 7,215,725 B2 * | 5/2007 | Yousef et al. | ............... | 375/346 |
| 7,302,024 B2 * | 11/2007 | Arambepola | ................. | 375/347 |
| 7,415,061 B2 * | 8/2008 | Currivan et al. | ............. | 375/144 |
| 7,561,860 B2 * | 7/2009 | Matsumoto | .............. | 455/189.1 |
| 2001/0016475 A1 * | 8/2001 | Tsujishita et al. | ........... | 455/222 |
| 2002/0094836 A1 * | 7/2002 | Nakamura et al. | .......... | 455/522 |
| 2002/0197970 A1 * | 12/2002 | Jian et al. | ................. | 455/245.2 |
| 2003/0022650 A1 * | 1/2003 | Tsuji et al. | ................... | 455/296 |
| 2003/0063682 A1 * | 4/2003 | Shearer, III | ................. | 375/295 |
| 2003/0099287 A1 * | 5/2003 | Arambepola | ................. | 375/227 |
| 2004/0066865 A1 * | 4/2004 | Yousef et al. | ............... | 375/346 |

(Continued)

*Primary Examiner*—David C Payne
*Assistant Examiner*—Linda Wong
(74) *Attorney, Agent, or Firm*—Meyertons, Hood, Kivlin, Kowert & Goetzel, P.C.; Stephen J. Curran

(57) ABSTRACT

A radio receiver includes a processing unit that may generate a respective phase value corresponding to each of a plurality of digital samples of a received complex frequency modulation (FM) signal. The receiver also includes an impulse unit that may detect whether a linear combination of a phase value of a current sample and a phase value of one or more previous samples will produce an impulse at an output of an FM demodulator. If the impulse unit detects that an impulse will be produced at the output, the impulse unit may replace the output of the FM discriminator with a predetermined value.

15 Claims, 3 Drawing Sheets

U.S. PATENT DOCUMENTS

| | | | |
|---|---|---|---|
| 2004/0085891 A1* | 5/2004 | Henriksson | 370/203 |
| 2004/0203551 A1* | 10/2004 | Li et al. | 455/296 |
| 2004/0247060 A1* | 12/2004 | Shibuya et al. | 375/346 |
| 2005/0147186 A1* | 7/2005 | Funamoto et al. | 375/324 |
| 2006/0079197 A1* | 4/2006 | Wu et al. | 455/337 |
| 2007/0002972 A1* | 1/2007 | Taipale | 375/320 |
| 2007/0124624 A1* | 5/2007 | Starr | 714/700 |

* cited by examiner

IMPULSE DETECTION AND REDUCTION IN A FREQUENCY MODULATION RADIO RECEIVER

BACKGROUND OF THE INVENTION

1. Field of the Invention

This invention relates to radio receivers and, more particularly, to impulse reduction within frequency modulation (FM) receivers.

2. Description of the Related Art

Frequency modulation (FM) radio is widely used in many applications. One reason FM became more popular for music broadcasts than, for example, amplitude modulation (AM), is in many cases FM reception is less affected by noise than AM. In an FM signal, the transmitted carrier signal frequency is varied by the frequency of the information (e.g., at an audio rate) within a given bandwidth. In an AM signal, the transmitted carrier signal amplitude is varied by the frequency of the information (e.g., at an audio rate), thereby creating an envelope that is defined by the information frequency. As such, a significant drawback to AM signals is the amount of noise that may be present in the received signal. In many FM receivers, the effects of received noise may be reduced using various well-known methods such as limiting or over-driving. Since noise in an FM signal may be "riding" on the peaks of the received signal, much of the noise may be removed, while the information carried by the signal remains.

However in low signal level environments, the difference between the noise and the signal may become increasingly smaller (e.g., low signal-to-noise ratio). In FM, the instantaneous frequency includes the transmitted information. Many FM receivers demodulate the FM signal by obtaining the instantaneous frequency of the signal by differentiating the phase of the signal. At low signal levels, an increase in the noise (especially additive noise) in the received signal may cause the output of the demodulator to include unwanted impulses.

SUMMARY

Various embodiments of an FM radio receiver including impulse detection and reduction are disclosed. In one embodiment, the radio receiver includes a processing unit that may generate a respective phase value corresponding to each of a plurality of digital samples of a received complex frequency modulation (FM) signal. The receiver also includes an impulse unit that may detect whether a linear combination of a phase value of a current sample and a phase value of one or more previous samples will produce an impulse at an output of an FM demodulator.

In one specific implementation, if the impulse unit detects a linear combination of a phase value of a current sample and a phase value of one or more previous samples will produce an impulse at an FM demodulation output, the impulse unit may replace the output of the FM discriminator with a predetermined value such as zero, for example.

Figure 1:
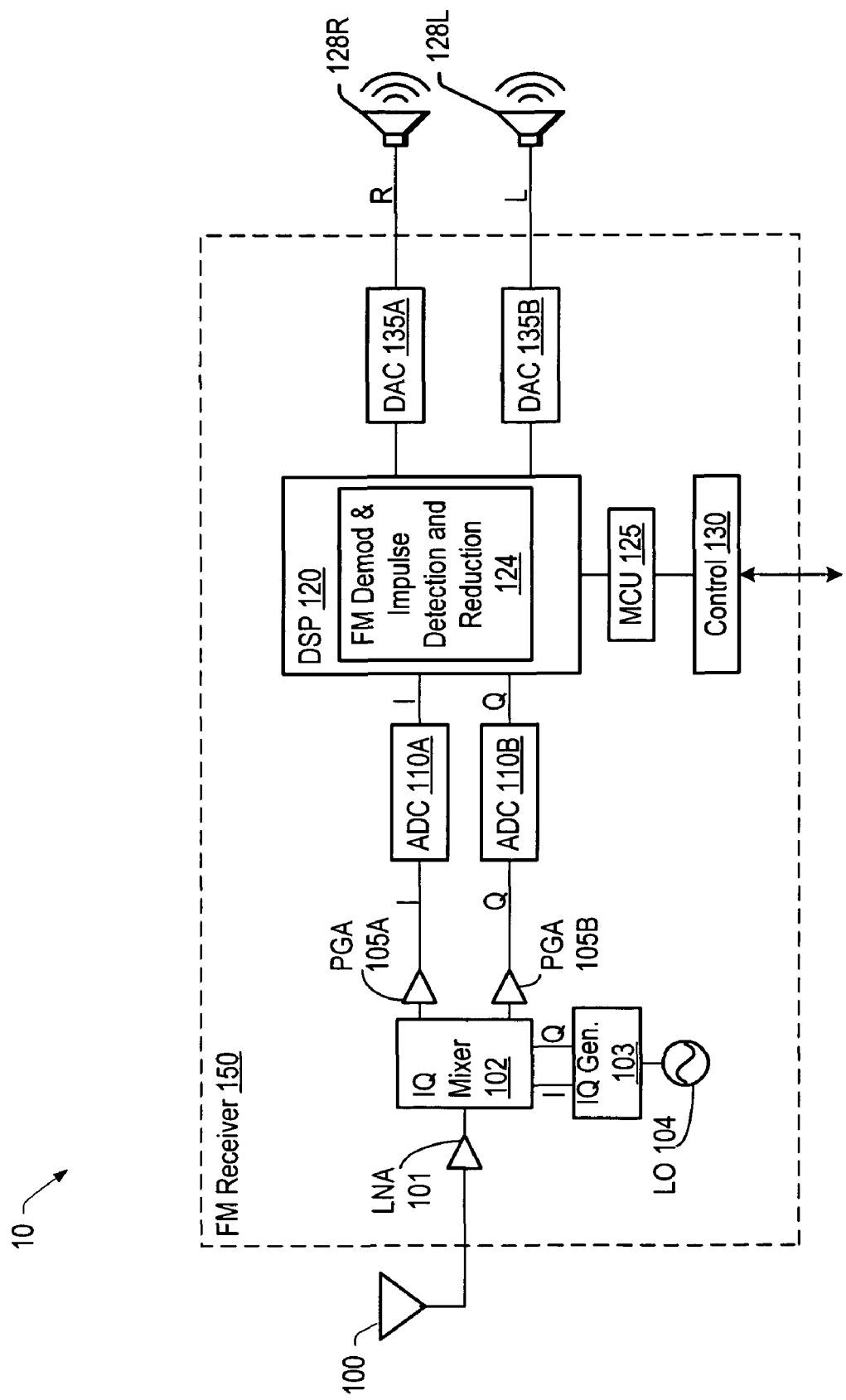
FIG. 1 is a block diagram of one embodiment of a radio system including a frequency modulation (FM) receiver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

Turning now to FIG. 1, a block diagram of one embodiment of a radio system is shown. Radio system 10 includes a frequency modulation (FM) receiver 150 that is coupled to a receiver antenna 100 and to a pair of speakers 128R and 128L. In various embodiments, FM receiver 150 may be configured to operate alone or as part of any of a variety of radio systems. For example, FM receiver 150 may be part of an FM radio, or part of a wireless communication device, such as a cellular telephone handset that includes FM reception functionality. Additionally, FM receiver 150 may be configured to operate as part of a multifunction radio system such as a car or home stereo system. As such, radio system 10 may be representative of any type of radio system that may include an FM receiver.

In the illustrated embodiment, FM receiver 150 includes a low noise amplifier (LNA) 101 that is coupled to receive an RF signal from antenna 100. LNA 101 is a part of the receiver that may be referred to as the RF front end. The output of LNA 101 is coupled to an in-phase/quadrature (IQ) mixer 102. IQ mixer 102 is coupled to a quadrature generator, designated IQ Gen. 103, which may provide quadrature local oscillator (LO) signals to IQ mixer 102. A receiver LO is coupled to IQ generator 103. The in-phase (I) and quadrature (Q) outputs of IQ mixer 102 are coupled to programmable gain amplifiers (PGAs) 105A and 105B, respectively. PGAs 105A and 105B are coupled to analog-to-digital converters (ADC) 110A and 110B, respectively, which are in turn coupled to a processing subsystem.

As shown in FIG. 1, the FM receiver 150 includes a digital signal processor (DSP) 120. DSP 120 is coupled to a microcontroller unit designated MCU 225, which is in turn coupled to a control unit 130. In addition, DSP 120 is coupled to a digital-to-analog-converter (DAC) 135A and 135B. As shown, DAC 135A and 135B may be coupled to stereo speakers such as speakers 128R and 128L, respectively. It is noted that FM receiver 150 may include other components that have been omitted for simplicity. It also noted that in some embodiments only one speaker may used as desired.

As described above, FM receiver 150 may receive frequency-modulated signals at an RF frequency from antenna 100 and may provide the modulated signals at a lower frequency to the processing circuits. In one embodiment, FM receiver 150 may be configured to receive RF signals in the range of 76 MHz to 108 MHz, although other frequencies are possible and contemplated. In the illustrated embodiment, FM receiver 150 is configured to heterodyne or mix the received RF signal with the receiver LO signal, resulting in the received RF signal being down-converted to a lower frequency. In some embodiments, this lower frequency may be the baseband frequency. Alternatively, in other embodiments, the down-converted frequency may be an intermediate frequency (IF), which may sometime be referred to as a low-IF. In such embodiments, an additional mixing stage (not shown) may be used to further down convert the IF to the baseband frequency. It is noted that the components used to down-convert the RF to a lower frequency may be referred to as being in the IF section.

During normal operation of FM receiver 150, LNA 101 may receive and amplify the incoming RF signal. The amplified RF signal is applied to both the I and Q portions of IQ mixer 102. IQ generator 103 receives the LO signal and generates quadrature LO signals for use by IQ mixer 102. IQ mixer 102 may be configured to mix the incoming modulated RF signal with the quadrature LO signals to produce a modulated I and Q signal pair. The I and Q signal pair is conveyed to the remaining portions of FM receiver 150 in I and Q channels. It is noted that as used herein, any device that generates or propagates an I and Q signal pair may be referred to as an IQ signal source relative to a device that consumes or sinks an I and Q signal pair. Thus, for example, IQ mixer 102 may be referred to as an IQ signal source, as may PGAs 105A and 105B taken together, or ADC 110A and 110B taken together.

The modulated I and Q signal pair is amplified by PGAs 105A and 105B and input into ADC 110A and 110B, respectively. In one embodiment, ADC 110A and 110B may be implemented as delta-sigma converters configured to convert the I and Q signals into respective I and Q bit streams which are input into DSP 120 for processing. In one embodiment, DSP 120 may operate on the samples using such functions as cordic processing and FM demodulation to recover the information in the received signal. After some additional processing, the information may then be provided to DAC 135A and 135B as stereo left and right outputs. DAC 135A and 135B may generate the analog L and R output signals that correspond to the digital outputs of DSP 120.

In the illustrated embodiment, MCU 125 may be configured to execute program instructions associated with application software and control functionality for FM receiver 150. In addition, control unit 130 may provide an interface for selected control functions associated with FM reception. For example, control unit 130 may provide tuning, volume, and other radio and audio function information to MCU 225.

DSP 120 may be representative of any of a variety of digital signal processors. As such, DSP 120 may include a processing engine including one or more execution units (not shown) configured to execute instructions, and one or more hardware accelerators configured to perform specific functions. In one embodiment, DSP 120 may process the I and Q bit streams from ADC 110A and 110B in groups that may be referred to as frames. For example, a given frame may include a number of samples.

In the illustrated embodiment, DSP 120 also includes an impulse unit 124 that may detect impulses and reduce or eliminate their effect on the demodulated FM signal. As mentioned above, additive noise in the received FM signal may cause impulses in the demodulator output. These impulses may manifest as unwanted audible noise in the audio output.

For an ideal complex FM signal (i.e., no noise), using complex polar coordinates, the magnitude may be constant and the phase may correspond to the integral of the modulating signal multiplied by a scaling factor. The scaling factor may determine the frequency deviation of the signal (i.e., the largest amount that the instantaneous frequency of the FM signal can deviate from the carrier frequency). An FM demodulator may recover the modulating signal by computing the derivative of the phase of the FM signal. For signals with a low signal to noise ratio (SNR), additive noise may cause large amplitude swings in the FM signal, which may cause phase swings on the order of $2\pi$ in a short time period. The derivative operation applied by the FM demodulator amplifies these large phase swings causing impulses at the demodulator output. Accordingly, as described in greater detail below in conjunction with the description of FIG. 2, impulse unit 124 may be configured to detect impulses and then reduce or eliminate the impulse at the output of the FM demodulator.

Figure 2:
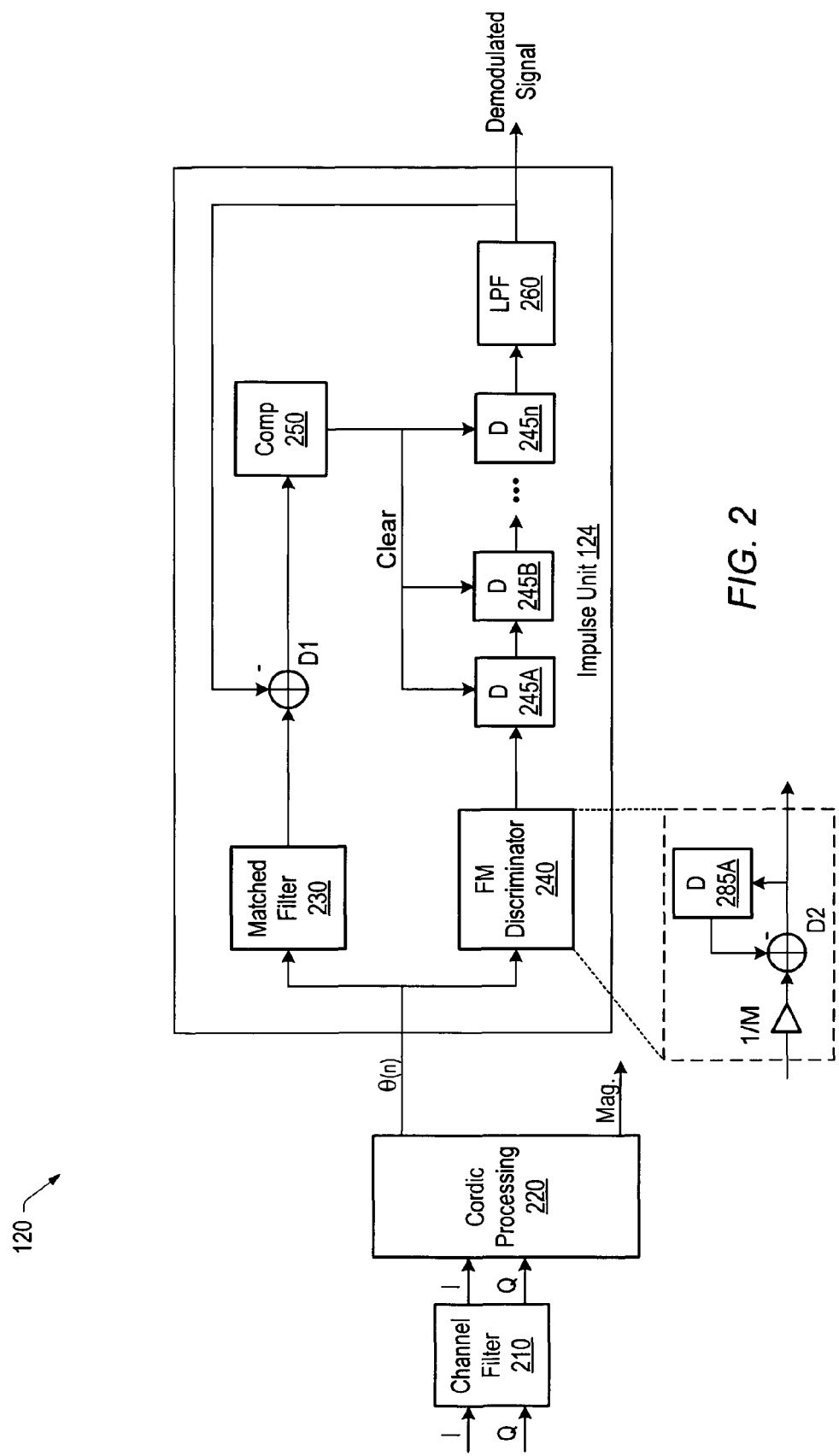
FIG. 2 is a block diagram illustrating detailed aspects of the embodiment of the FM receiver of FIG. 1.

Referring to FIG. 2, a block diagram illustrating more detailed aspects of one embodiment the FM receiver of FIG. 1 is shown. Components that correspond to components shown in FIG. 1 are numbered identically for clarity and simplicity. DSP 120 includes a channel filter 210 coupled to a cordic processing unit 220, which is coupled to impulse unit 124. As shown, impulse unit 124 includes a matched filter 230 that is coupled to a difference block D1. Difference block D1 is also coupled to compare unit 250 and to the output of low pass filter 260. Impulse unit 124 also includes an FM discriminator unit 240 that is coupled to a number of delay blocks designated 245A though 245n. The delay blocks may be representative of a M−1 previous phase sample values. The delay block 245n is coupled to LPF 260. In addition the output of compare unit 250 is coupled to each of delay blocks 245. It is noted that block 245A may represent the most recent previous sample. As described further below, in other embodiments, D1 may be omitted, and the matched filter output may be provided directly to compare unit 250.

In one embodiment, ADC 110A and 110B may sample the received signal at a given sample frequency (e.g., 512 kHz). The samples may be grouped into a number of frames each having a number of samples (e.g., 16 sample frames). During each frame, the samples are provided to cordic processing unit 220. Accordingly, cordic processing unit 220 may be configured to receive the I and Q bit streams from ADC 210A and 210B. Cordic processing unit 220 may be configured to transform the samples of the complex FM signal from the rectangular coordinate system (I and Q), to the polar coordinate system (magnitude and phase). As such, cordic processing unit 220 may provide a magnitude value and phase value ($\theta(n)$) for each received sample.

It is noted that in other embodiments, cordic processing unit 220 may be replaced by other functional units that transform the samples from rectangular to polar coordinates. It is also noted that cordic processing unit 220 may be implemented as a hardware accelerator of DSP 120. Alternatively, cordic processing unit 220 may be implemented as program instructions executed by a processing engine of DSP 120. In addition, it is contemplated that other functional blocks of DSP 120, and more generally various components of FM receiver 150, may be implemented in hardware or software, or a combination of both, as desired.

During each frame, impulse unit 124 receives the phase value of each sample from cordic processing unit 220. Specifically, the phase value is provided to matched filter 230 and to FM discriminator 240. The output of FM discriminator 240 is passed through one or more of delay blocks 245, such that that a number of FM discriminator outputs are held in the various delay stages. The output of the last delay block stage is provided to LPF 260. In the illustrated embodiment, the output of LPF 260 is the demodulated FM signal.

One embodiment of FM discriminator 240 is shown as a first order difference discriminator in an exploded view. Accordingly, FM discriminator 240 includes scaling factor multiplier (1/M) coupled to a difference block D2, which is coupled to an input of delay block 285A. Delay block 285A may represent the most recent previous phase sample value.

The output of delay block 285A is coupled to a minus input to D2. Accordingly, the demodulated FM signal for the current sample may be output to the first delay block. It is noted that in other embodiments, other types of FM discriminators may be used. For example, FM discriminator 240 may be implemented as a phase locked loop (PLL), or a quadrature detector, or the like. It is also noted that in one embodiment, block D2 may be implemented to use 2's complement wrap arithmetic.

Figure 3:
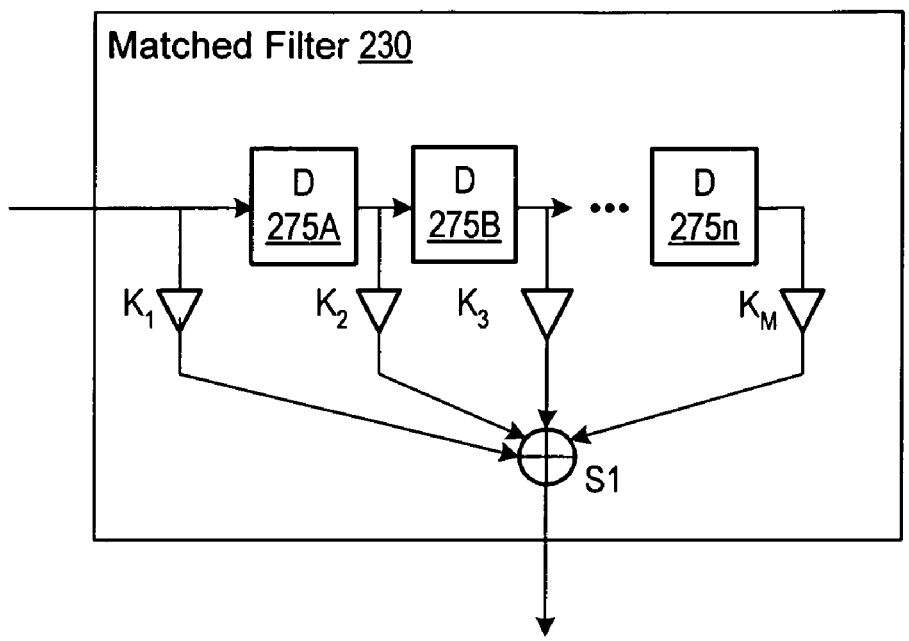
FIG. 3 is a block diagram of one embodiment of the matched filter of FIG. 2.
Figure 4:
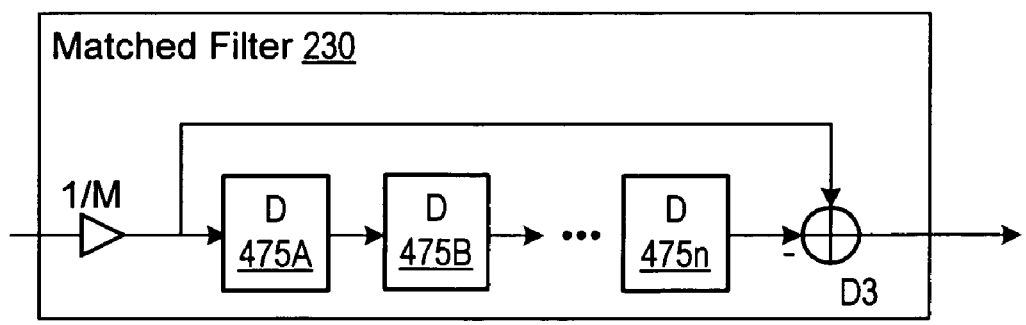
FIG. 4 is a block diagram of another embodiment of the matched filter of FIG. 2.

As described above, large excursions in the phase of the received complex FM signal may cause impulses at the output of LPF 260. Accordingly, to detect conditions that may cause these impulses, the phase values of each sample are provided to matched filter 230. Matched filter 230 may receive and store a number of previous phase value samples. In addition, matched filter 230 may calculate a linear combination of the current phase value sample and one or more of the previous phase value samples. For example, in one embodiment, matched filter 230 may generate the linear combination by multiplying the current phase value sample and each of the previous phase value samples by a weighting factor and summing each weighted value. An exemplary diagram of such an embodiment is shown in FIG. 3. Alternatively, as shown in FIG. 4, matched filter 230 may calculate a difference between the phase of the current sample and the phase of M samples behind.

In the illustrated embodiment, the output of LPF 260 (the demodulated FM signal) is also provided as the minus input to difference block D1. The output of matched filter 230 is also provided to difference block D1. A difference value corresponding to the difference between the matched filter output and the output of LPF 260 is provided to compare unit 250.

In one embodiment, compare unit 250 may square the difference value and compare the squared value to a threshold value. The threshold value represents a value above which, the difference value may correspond to an impulse. More particularly, if the square of the difference value is larger than or equal to the threshold value, it is indicative that an impulse has been detected. Conversely, if the square of the difference value is lower than the selected threshold, an impulse has not been detected. As such, compare unit 250 may output a clear signal that is indicative of whether or not an impulse was detected. It is noted that in other embodiments, instead of squaring the difference value, an absolute value or other positive value corresponding to the difference value may be used. Once the impulse has been detected, the impulse may be dealt with in various ways such as interpolation between I/Q samples, or interpolation between phase value samples, for example. As described below, another way to deal with the impulse is to replace the discriminator output.

More particularly, in one embodiment upon detection of an impulse, the discriminator output may be replaced with a zero value (or other predetermined value that does not cause an impulse). For example, in one embodiment, in response to assertion of the clear signal, one or more of the values within the delay block stages 245A-245n may be replaced with zero values. In this way, the impulse may be reduced and/or eliminated from the FM discriminator output. Replacing the discriminator output with zero values for such samples may serve to smooth out the demodulated signal that would otherwise contain impulses. It is noted that other predetermined values may be used in place of the zero value, as desired. It is also noted that the threshold value may be programmably selected through software and/or hardware.

It is noted that an optimal threshold value may be a function of the frequency deviation of the FM signal (i.e., the amplitude or the modulating signal). For example, an FM signal with a wider frequency deviation may require a higher threshold than an FM signal with a smaller deviation. By subtracting the demodulated FM signal (output of LPF 260) from the output of matched filter 230 (as shown in FIG. 2), this frequency deviation dependency may be largely overcome. However, as mentioned above, difference block D1 may be omitted in some embodiments and the impulses may still be detected and effectively reduced or eliminated from the demodulated FM signal.

Referring to FIG. 3, one embodiment of the matched filter 230 of FIG. 2 is shown. Matched filter 230 includes a number of delay blocks that may be representative of M−1 previous phase sample values. The delay blocks are designated 275A though 275n. Matched filter 230 also includes a number of multiplier blocks designated K1 through Km, each of which may be representative of any multiplier value. Each of delay blocks 275A-275n is coupled to a respective K multiplier, and each K multiplier is coupled to a summing block S1. Accordingly, a weighted sum of the current phase sample and one or more of the previous phase samples may be calculated and output form matched filter 230.

Referring to FIG. 4, another embodiment of the matched filter 230 of FIG. 2 is shown. More particularly, since cordic processing unit 220 generates phase values in the range [1, −1] corresponding to [π, −π], a scaling factor=1/M may scale the filter output to be within [1, −1]. As such, matched filter 230 of FIG. 4 includes a scaling factor (1/M) multiplier. The 1/M multiplier is coupled to a difference block D3 and to a number of delay blocks designated 475A though 475n. Delay blocks 475A-475n may be representative of M−1 previous phase sample values. As such, matched filter 230 may calculate a difference value corresponding to a difference between a current sample phase value and phase values of one or more previous samples. It is noted that in one embodiment, block D3 may be implemented to use 2's complement wrap arithmetic.

It is noted that in some embodiments, the components of FM receiver 150 may be included as part of a single integrated circuit (IC). As such, the individual blocks or components shown in the figures are merely exemplary functional blocks drawn for discussion purposes. Indeed, it is contemplated that in other embodiments, functionality associated with a given block may be combined with other blocks as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A radio receiver comprising:
    a processing unit configured to generate a respective phase value corresponding to each of a plurality of digital samples of a received complex frequency modulation (FM) signal; and
    an impulse unit configured to detect whether a linear combination of a phase value of a current sample and a phase value of one or more previous samples will produce an impulse at an output of an FM demodulator;
    wherein the impulse unit includes a matched filter configured to calculate and output a value corresponding to the linear combination of the phase value of the current sample and the phase value of one or more previous samples;

wherein the impulse unit is further configured to calculate a difference value by subtracting the output of the FM demodulator from the value corresponding to the linear combination; and wherein in response to detecting the linear combination of the phase value of the current sample and the phase value of one or more previous samples will produce an impulse at an FM demodulation output, the impulse unit is configured to replace an output of an FM discriminator with a predetermined value.

2. The radio receiver as recited in claim 1, wherein in response to detecting the linear combination of the phase value of the current sample and the phase value of one or more previous samples will not produce an impulse at an FM demodulation output, the impulse unit is configured to use the output of an FM demodulator as an FM demodulated output.

3. The radio receiver as recited in claim 1, wherein the predetermined value is equal to zero.

4. The radio receiver as recited in claim 1, wherein the value corresponding to the linear combination comprises a first difference value that corresponds to the phase difference between the phase value of the current sample and the phase value of one or more previous samples.

5. The radio receiver as recited in claim 1, wherein the value corresponding to the linear combination comprises a weighted sum of the phase value of the current sample and the phase value of one or more previous samples.

6. The radio receiver as recited in claim 1, wherein the impulse unit includes a compare unit configured to compare a threshold value to a positive value corresponding to the value corresponding to the linear combination.

7. The radio receiver as recited in claim 1, wherein the impulse unit includes a compare unit configured to compare a positive value corresponding to the difference value to a threshold value.

8. The radio receiver as recited in claim 7, wherein if the positive value is greater than or equal to the threshold value, the compare unit is configured to provide a signal indicating that the linear combination of a phase value of a current sample and a phase value of one or more previous samples will produce an impulse.

9. The radio receiver as recited in claim 7, wherein if the positive value is less than the threshold value, the compare unit is configured to provide a signal indicating that the linear combination of a phase value of a current sample and a phase value of one or more previous samples will not produce an impulse.

10. A method comprising:
    generating a respective phase value corresponding to each of a plurality of digital samples of a received complex frequency modulation (FM) signal; and
    detecting whether a linear combination of a phase value of a current sample and a phase value of one or more previous samples will produce an impulse at an output of an FM demodulator;
    calculating and outputting a value corresponding to the linear combination of the phase value of the current sample and the phase value of one or more previous samples;
    calculating a difference value by subtracting the output of the FM demodulator from the value corresponding to the linear combination; and
    replacing an output of an FM discriminator with a predetermined value in response to detecting the linear combination of the phase value of the current sample and the phase value of one or more previous samples will produce the impulse.

11. The method as recited in claim 10, further comprising using the output of the FM demodulator as an FM demodulated output in response to detecting the linear combination of the phase value of the current sample and the phase value of one or more previous samples will not produce the impulse.

12. The method as recited in claim 10, wherein the predetermined value is equal to zero.

13. The method as recited in claim 10, further comprising comparing a threshold value to a positive value corresponding to the value corresponding to the linear combination.

14. The method as recited in claim 13, further comprising providing a signal indicating that the linear combination of a phase value of a current sample and a phase value of one or more previous samples will produce an impulse if the positive value is greater than or equal to the threshold value.

15. A radio receiver comprising:
    a processing unit configured to generate a respective phase value corresponding to each of a plurality of digital samples of a received complex frequency modulation (FM) signal; and
    an impulse unit configured to replace an output of an FM discriminator with a predetermined value in response to a determination that a linear combination of a phase value of a current sample and a phase value of one or more previous samples will produce an impulse at an FM demodulation output;
    wherein the impulse unit includes a matched filter configured to calculate and output a value corresponding to the linear combination of the phase value of the current sample and the phase value of one or more previous samples; and
    wherein the impulse unit is further configured to calculate a difference value by subtracting the output of the FM demodulator from the value corresponding to the linear combination.

* * * * *